United States Patent
Yang et al.

(10) Patent No.: US 12,262,607 B2
(45) Date of Patent: Mar. 25, 2025

(54) STRETCHABLE DISPLAY PANEL AND DISPLAY DEVICE

(71) Applicant: BOE TECHNOLOGY GROUP CO., LTD., Beijing (CN)

(72) Inventors: Qian Yang, Beijing (CN); Jianchao Zhu, Beijing (CN); Bo Wang, Beijing (CN); Jingquan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 506 days.

(21) Appl. No.: 17/631,372

(22) PCT Filed: Feb. 20, 2021

(86) PCT No.: PCT/CN2021/077082
§ 371 (c)(1),
(2) Date: Jan. 28, 2022

(87) PCT Pub. No.: WO2021/169879
PCT Pub. Date: Sep. 2, 2021

(65) Prior Publication Data
US 2022/0328604 A1 Oct. 13, 2022

(30) Foreign Application Priority Data
Feb. 26, 2020 (CN) .......................... 202010121483.6

(51) Int. Cl.
*H10K 59/131* (2023.01)
*G09F 9/30* (2006.01)
*H10K 77/10* (2023.01)

(52) U.S. Cl.
CPC ........... *H10K 59/131* (2023.02); *G09F 9/301* (2013.01); *H10K 77/111* (2023.02)

(58) Field of Classification Search
CPC ............ H10K 77/111; H10K 2102/311; H10K 59/121; H10K 59/122; H10K 59/1213;
(Continued)

(56) References Cited

U.S. PATENT DOCUMENTS

2016/0268352 A1   9/2016   Hong et al.
2017/0278920 A1   9/2017   Park et al.
(Continued)

FOREIGN PATENT DOCUMENTS

CN   105977276 A   9/2016
CN   107221549 A   9/2017
(Continued)

OTHER PUBLICATIONS

The First Office Action for Chinese Patent Application No. 202010121483.6 issued by the Chinese Patent Office on Apr. 19, 2021.
(Continued)

*Primary Examiner* — Younes Boulghassoul
*Assistant Examiner* — Quinton A Brasfield
(74) *Attorney, Agent, or Firm* — XSENSUS LLP

(57) ABSTRACT

A stretchable display panel has a plurality of island regions and a plurality of bridge regions. The island regions are arranged in an array. Every two adjacent island regions are connected with a bridge region in the bridge regions therebetween. The display panel includes a plurality of sub-pixels and a plurality of signal line groups. At least one sub-pixel is provided in each island region. The signal line groups are located in a same conductive layer. Each signal line group extends along bridge regions to island regions that are connected to the bridge regions. The signal line group includes a plurality of signal lines arranged in parallel and at intervals. Each signal line is electrically connected to sub-pixels in the island regions.

16 Claims, 8 Drawing Sheets

(58) Field of Classification Search
CPC ..... H10K 59/131; G09F 9/301; G06F 1/1652; B60K 35/223
See application file for complete search history.

(56) References Cited

U.S. PATENT DOCUMENTS

| | | | |
|---|---|---|---|
| 2018/0046221 A1* | 2/2018 | Choi | H05B 33/22 |
| 2018/0090699 A1* | 3/2018 | Shin | H10K 59/873 |
| 2018/0315387 A1 | 11/2018 | Park et al. | |
| 2019/0140044 A1* | 5/2019 | Park | H10K 59/8731 |
| 2020/0020273 A1 | 1/2020 | Hong et al. | |
| 2020/0105170 A1 | 4/2020 | Dai et al. | |
| 2020/0312248 A1* | 10/2020 | Shin | G09G 3/3291 |
| 2021/0049939 A1 | 2/2021 | Sui et al. | |
| 2021/0175448 A1 | 6/2021 | Ban et al. | |
| 2021/0193774 A1* | 6/2021 | Won | H10K 59/131 |

FOREIGN PATENT DOCUMENTS

| | | |
|---|---|---|
| CN | 108806573 A | 11/2018 |
| CN | 109064900 A | 12/2018 |
| CN | 109308851 A | 2/2019 |
| CN | 110350014 A | 10/2019 |
| CN | 110444575 A | 11/2019 |
| CN | 110718555 A | 1/2020 |
| CN | 111210726 A | 5/2020 |

OTHER PUBLICATIONS

The Second Office Action for Chinese Patent Application No. 202010121483.6 issued by the Chinese Patent Office on Dec. 24, 2021.

* cited by examiner

STRETCHABLE DISPLAY PANEL AND DISPLAY DEVICE

CROSS-REFERENCE TO RELATED APPLICATIONS

This application is a national phase entry under 35 USC 371 of International Patent Application No. PCT/CN2021/077082 filed on Feb. 20, 2021, which claims priority to Chinese Patent Application No. 202010121483.6, filed on Feb. 26, 2020, which are incorporated herein by reference in their entirety.

TECHNICAL FIELD

The present disclosure relates to the field of display technologies, and in particular, to a stretchable display panel and a display device.

BACKGROUND

With the development of display technologies, display devices are gradually applied to various industries. A display device includes a display panel. Traditional display panels are rigid display panels, which can no longer meet people's application requirements for display panels, so stretchable display panels emerge as the times require.

The stretchable display panels have gradually attracted people's attention because they can meet needs of various special structures.

SUMMARY

In an aspect, a stretchable display panel is provided. The display panel has a plurality of island regions and a plurality of bridge regions, the plurality of island regions are arranged in an array, and every two adjacent island regions are connected with a bridge region in the plurality of bridge regions therebetween. The display panel includes a plurality of sub-pixels and a plurality of signal line groups. At least one sub-pixel is provided in each island region. The plurality of signal line groups are located in a same conductive layer, and each signal line group extends along bridge regions to island regions that are connected to the bridge regions. The signal line group includes a plurality of signal lines arranged in parallel and at intervals. Each signal line is electrically connected to sub-pixels in the island regions.

In some embodiments, the plurality of bridge regions include a plurality of first bridge regions and a plurality of second bridge regions. A first bridge region in the plurality of first bridge regions is connected between two adjacent island regions in a first direction, and a second bridge region in the plurality of second bridge regions is connected between two adjacent island regions in a second direction. The first direction is a row direction in which the plurality of island regions are arranged in the array, and the second direction is a column direction in which the plurality of island regions are arranged in the array.

The plurality of signal line groups include a plurality of first signal line groups and a plurality of second signal line groups. Each first signal line group extends in the first direction as a whole, and the first signal line group extends along first bridge regions to island regions that are connected to the first bridge regions and is electrically connected to sub-pixels in the island regions. Each second signal line group extends in the second direction as a whole, and the second signal line group extends along second bridge regions to island regions that are connected to the second bridge regions and is electrically connected to sub-pixels in the island regions.

In some embodiments, the second signal line group includes at least one reference voltage signal line. The first signal line group includes at least one equipotential signal line. In the at least one equipotential signal line, an equipotential signal line includes a plurality of equipotential wiring segments. Every two adjacent equipotential wiring segments are electrically connected to each other. Each equipotential wiring segment extends along a first bridge region in the plurality of first bridge regions, and two ends of the equipotential wiring segment are electrically connected to reference voltage signal lines in two island regions that are connected to the first bridge region.

In some embodiments, the display panel further includes a plurality of connection pattern layers. Each island region is provided with a connection pattern layer therein. In the island region, at least one of an equipotential signal line and a reference voltage signal line is electrically connected to the connection pattern layer.

In some embodiments, the display panel further includes a base, and a first gate conductive layer, a second gate conductive layer, an interlayer dielectric layer and a source-drain conductive layer that are sequentially stacked on the base. The plurality of signal line groups are located in the source-drain conductive layer, and the plurality of connection pattern layers are located in the second gate conductive layer.

The interlayer dielectric layer is provided with a plurality of via holes therein, and the at least one of the equipotential signal line and the reference voltage signal line is electrically connected to the connection pattern layer through at least one via hole.

In some embodiments, the at least one reference voltage signal line includes at least two reference voltage signal lines. Each connection pattern layer includes a plurality of bridge portions. Two equipotential wiring segments that extend to a same island region and are electrically connected to each other are a first equipotential wiring segment and a second equipotential wiring segment. The first equipotential wiring segment is electrically connected to a reference voltage signal line in the same island region through a bridge portion in a plurality of bridge portions of a connection pattern layer in the same island region, and the second equipotential wiring segment is directly electrically connected to another reference voltage signal line in the same island region.

In some embodiments, the second signal line group further includes a plurality of data signal lines. An orthogonal projection of at least one data signal line on the base is spaced between an orthogonal projection of an end portion, electrically connected to the reference voltage signal line, of the first equipotential wiring segment on the base and an orthogonal projection of the reference voltage signal line, electrically connected to the first equipotential wiring segment, on the base. An orthogonal projection of the bridge portion on the base overlaps with the orthogonal projection of the at least one data signal line on the base.

An orthogonal projection of an end portion, electrically connected to the another reference voltage signal line, of the second equipotential wiring segment on the base overlaps with an orthogonal projection of the another reference voltage signal line, electrically connected to the second equipotential wiring segment, on the base.

In some embodiments, the first signal line group further includes a plurality of control signal lines including at least a gate scanning signal line, an initialization signal line, a light-emitting signal line, and a reset signal line. The second signal line group further includes a plurality of data signal lines.

A number of the control signal lines included in the first signal line group is less than a sum of a number of the reference voltage signal line and a number of the data signal lines included in the second signal line group. A dimension of the first bridge region in the second direction is substantially equal to a dimension of the second bridge region in the first direction.

In some embodiments, in the first signal line group, an equipotential signal line is located at a side of two opposite sides of the plurality of control signal lines in the second direction.

In some embodiments, the display panel further has a plurality of opening regions.

At least a portion of an opening region in the plurality of opening regions is disposed between two adjacent island regions in the first direction. A plurality of signal lines of a second signal line group in the plurality of second signal line groups, to which sub-pixels in the two adjacent island regions are electrically connected, are arranged substantially symmetrically with a center line in the second direction of the opening region corresponding to the two adjacent island regions as an axis of symmetry. And/or, at least a portion of another opening region in the plurality of opening regions is disposed between two adjacent island regions in the second direction. A plurality of signal lines of a first signal line group in the plurality of first signal line groups, to which sub-pixels in the two adjacent island regions are electrically connected, are arranged substantially symmetrically with a center line in the first direction of the opening region corresponding to the two adjacent island regions as an axis of symmetry.

In some embodiments, the opening regions each are in a shape of a capital H, and each include two side holes that are parallel to each other and a middle hole located between the two side holes. The middle hole is perpendicular to the two side holes, and both ends of the middle hole are communicated with the two side holes.

The plurality of opening regions include a plurality of first opening regions and a plurality of second opening regions. The plurality of first opening regions are arranged into a plurality of rows extending in the first direction, and middle holes of the first opening regions extend in the first direction. The plurality of second opening regions are arranged into a plurality of columns extending in the second direction, and middle holes of the second opening regions extend in the second direction. Two adjacent rows of first opening regions are staggered to each other, and two adjacent columns of second opening regions are staggered to each other.

The plurality of signal lines of the second signal line group, to which the sub-pixels in the two adjacent island regions in the first direction are electrically connected, are arranged substantially symmetrically with a middle hole of a second opening region corresponding to the two adjacent island regions as an axis of symmetry. And/or, the plurality of signal lines of the first signal line group, to which the sub-pixels in the two adjacent island regions in the second direction are electrically connected, are arranged substantially symmetrically with a middle hole of a first opening region corresponding to the two adjacent island regions as an axis of symmetry.

In some embodiments, in the first direction, the display panel has a first end and a second end opposite to each other. The second signal line group includes N data signal lines, and N is greater than or equal to 2. In the second bridge region, the N data signal lines are arranged in a sequence of a first data signal line to an N-th data signal line in the first direction and along a direction from the first end to the second end of the display panel.

An island region connected with the second bridge region is provided with N columns of sub-pixels. The N columns of sub-pixels are arranged in a sequence of a first column of sub-pixels to an N-th column of sub-pixels in the first direction and along the direction from the first end to the second end of the display panel.

Each column of sub-pixels is electrically connected to a data signal line, and a sum of a serial number of the column of sub-pixels and a serial number of the data signal line is equal to (N+1).

In some embodiments, the display panel further includes a plurality of pin groups. Each pin group corresponds to a second signal line group in the plurality of second signal line groups. The pin group includes N pins. The N pins are arranged in a sequence of a first pin to an N-th pin in the first direction and along the direction from the first end to the second end of the display panel. The N pins are electrically connected to N data signal lines of the corresponding second signal line group. In the pin group, an i-th pin is configured to be electrically connected to a source driver to receive data signals of an (N+1−i)-th column of sub-pixels from the source driver. i takes a value from 1 to N.

In some embodiments, the display panel further has a plurality of pin regions. Two pin groups corresponding to two second signal line groups that are arranged substantially symmetrically are provided in a same pin region.

In some embodiments, each signal line in the second signal line group is electrically connected to sub-pixels in each of the island regions after being bent twice. And/or, each signal line in the first signal line group is electrically connected to sub-pixels in each of the island regions after being bent twice.

In some embodiments, the bridge regions each are in a shape of a rectangle, a capital U, or a capital S. Each island region is connected to four bridge regions, the four bridge regions surround the island region, and a plurality of signal lines in the four bridge regions are arranged symmetrically with respect to a center of the island.

In another aspect, a display device is provided. The display device includes the display panel as described in any one of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
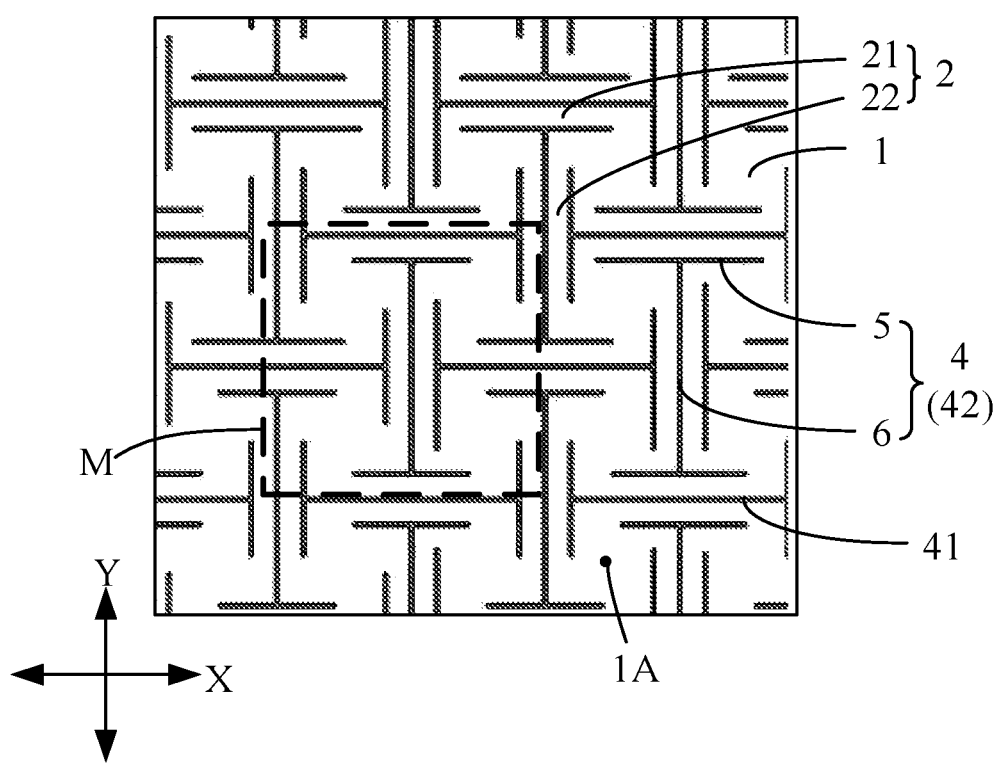
FIG. 1 is a top view of a display panel, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as open and inclusive, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined by "first" and "second" may explicitly or implicitly include one or more of the features. In the description of the embodiments of the present disclosure, the term "a plurality of/the plurality of" means two or more unless otherwise specified.

In the description of some embodiments, the term "electrically connected" and its extensions may be used to indicate that two or more components are in electrically contact with each other.

The phrase "A and/or B" includes the following three combinations: only A, only B, and a combination of A and B.

The phrase "applicable to" or "configured to" used herein has an open and inclusive meaning, which does not exclude devices that are applicable to or configured to perform additional tasks or steps.

The term "substantially" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thicknesses of layers and regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

In the related art, regions for arranging signal lines inside a stretchable display panel is limited by a complex design of regions inside the display panel. In order to achieve electrical connections between signal lines and respective sub-pixels in a display area, a part of the signal lines needs to cross a conductive layer where another part of the signal lines is located (which is also referred to as a "cross-layer jumper"). Two adjacent signal lines are spaced by an insulating layer to achieve the cross-layer jumper of the signal lines and avoid a short circuit between the signal lines.

However, due to the jumper of the signal lines, there is an overlapping portion between the signal lines in a direction perpendicular to a plane on which the display panel is located, which causes a coupling phenomenon between voltage signals transmitted by different signal lines, thereby resulting in a mutual interference between the signals, and thus reducing the display quality of the display panel.

Figure 2:
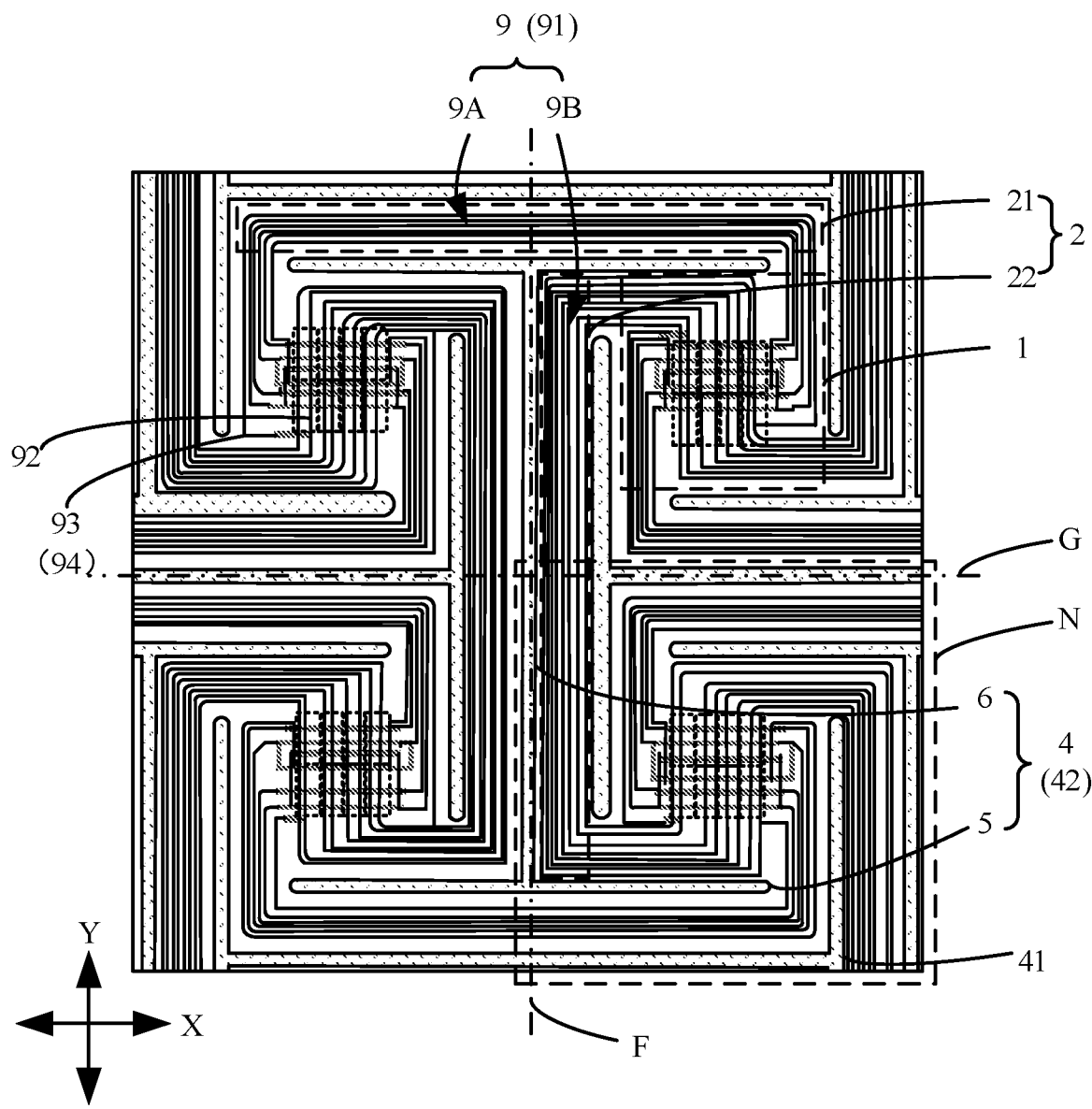
FIG. 2 is a partial enlarged view of the region M in FIG. 1.

In order to solve the problems, as shown in FIGS. 1 and 2, some embodiments of the present disclosure provide a stretchable display panel 100 having a plurality of island regions 1 and a plurality of bridge regions 2. The plurality of island regions 1 are arranged in an array, every two adjacent island regions 1 are connected with a bridge region 2 therebetween, which achieve connections among the island regions 1, thereby ensuring the structural integrity of the display panel 100.

For example, every two adjacent island regions 1 are connected through a bridge region 2.

Figure 3:
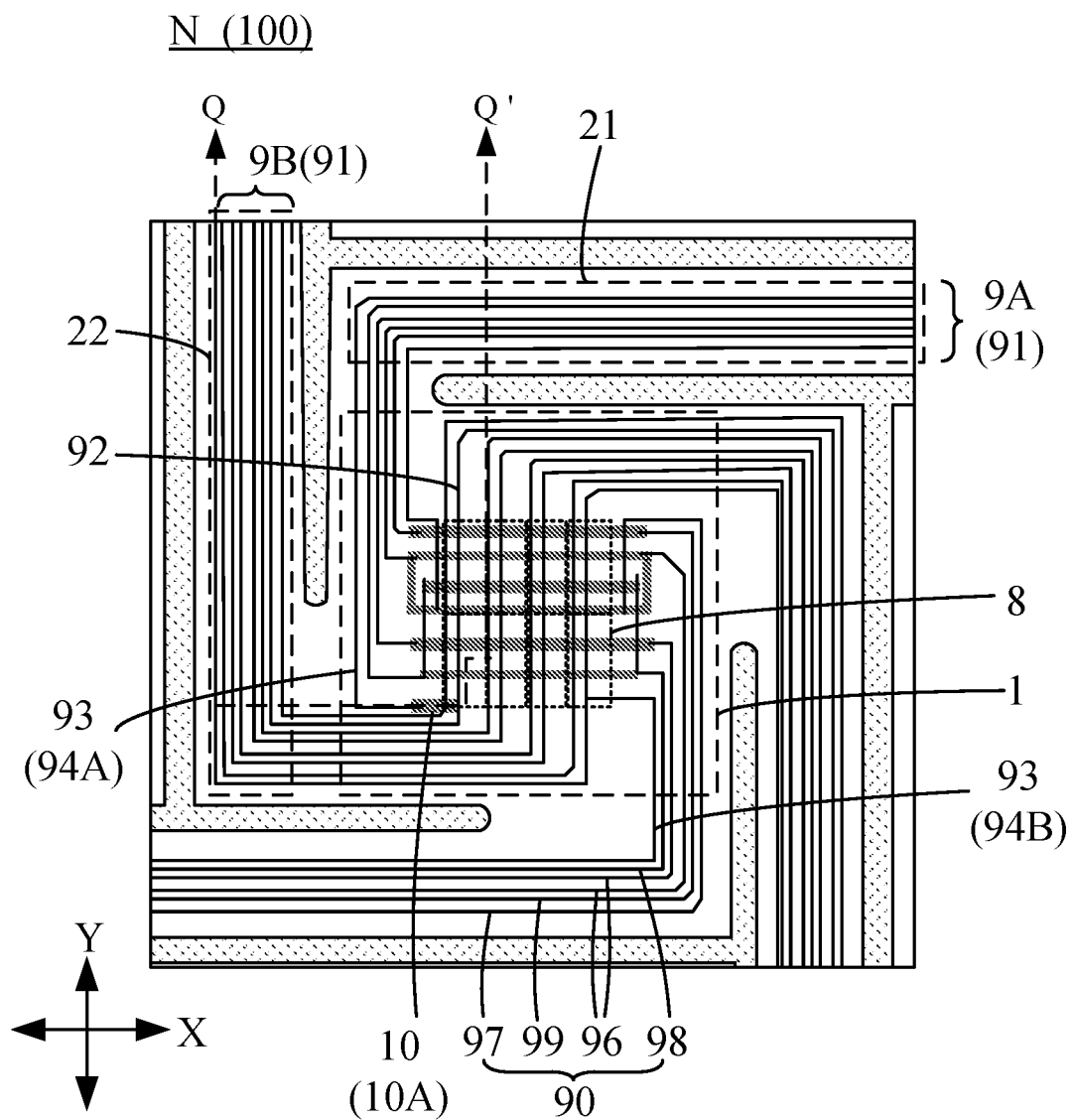
FIG. 3 is a partial enlarged view of the region N in FIG. 2.
Figure 4:
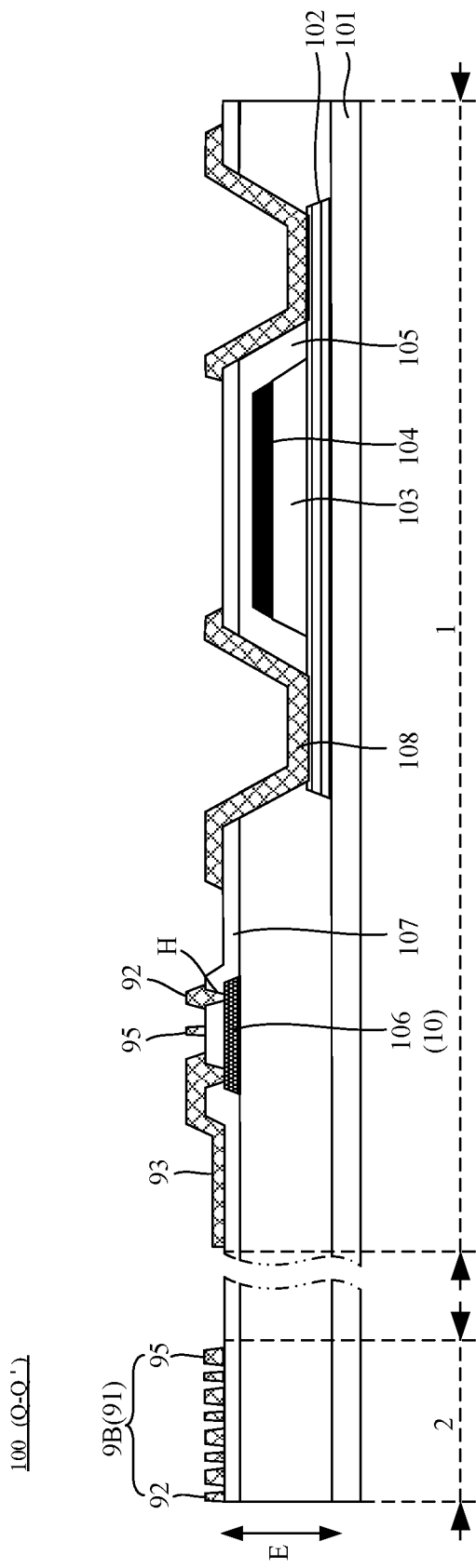
FIG. 4 is a partially sectional view taken along the line Q-Q' in FIG. 3.

As shown in FIGS. 3 and 4, the display panel 100 includes a plurality of sub-pixels 8, and each island region 1 is provided with at least one sub-pixel 8 therein.

For example, each island region 1 is provided with a plurality of sub-pixels 8 therein. The plurality of sub-pixels 8 may include at least first color sub-pixels, second color sub-pixels and third color sub-pixels. The first color, the second color and the third color may be three primary colors, such as red, green and blue. It will be understood that each sub-pixel 8 as the smallest light-emitting unit may emit light of a single primary color.

As shown in FIGS. 2 and 3, the display panel 100 further includes a plurality of signal line groups 9. The plurality of signal line groups 9 are located in a same conductive layer. Each signal line group 9 extends along bridge regions 2 to island regions 1 that are connected to the bridge regions 2. By providing the bridge regions 2, wiring regions are provided for the signal line groups 9.

It will be noted that the description that "the plurality of signal line groups 9 are located in the same conductive layer" may mean that the plurality of signal line groups 9 are made of a same material and disposed in a same layer. "The same layer" means that the conductive layer used for forming the signal line groups 9 is formed through a same film forming process, and then the signal line groups 9 are formed through a single patterning process using a same mask.

Each signal line group 9 includes a plurality of signal lines 91 arranged in parallel and at intervals. Each signal line 91 is electrically connected to a plurality of sub-pixels 8 in an island region 1.

It will be understood that different signal lines 91 are used for transmitting different voltage signals, and each signal line 91 is used for transmitting voltage signals to the plurality of sub-pixels 8 electrically connected thereto, so as to control or drive the plurality of sub-pixels 8 to emit light.

In the display panel 100 of the embodiments of the present disclosure, by arranging the plurality of signal line groups 9 in the same conductive layer, it is possible to avoid that there are overlapping portions among the signal lines 91 in a direction E (referring to FIG. 4) perpendicular to a plane on which the display panel 100 is located, thereby weakening the coupling phenomenon between voltage signals transmitted by different signal lines 91 and reducing the mutual interference between the signals, and thus improving the display quality of the display panel 100.

In addition, the plurality of signal lines 91 included in each signal line group 9 are in the same conductive layer, and are arranged in parallel and at intervals, so that there is a distance between two adjacent signal lines 91, and distances between the two adjacent signal lines 91 at various positions are approximately equal. In this way, it may be possible to further weaken the coupling phenomenon between the voltage signals transmitted by different signal lines 91 and reduce the mutual interference between the signals.

In addition, by arranging the plurality of signal line groups 9 in the same conductive layer, it may be possible to avoid the cross-layer jumpers of the signal lines 91, thereby avoiding the overlapping portions among the signal lines 91 in the direction E, which helps to reduce a dimension of the display panel 100 in the direction E, i.e., a thickness of the display panel 100, and thus achieving the lightness and thinness of the display panel 100.

In some embodiments, as shown in FIGS. 1 and 2, a row direction in which the plurality of island regions 1 are arranged in the array is a first direction X, and a column direction in which the plurality of island regions 1 are arranged in the array is a second direction Y.

The plurality of bridge regions 2 includes a plurality of first bridge regions 21 and a plurality of second bridge regions 22. A first bridge region 21 is connected between two adjacent island regions 1 in the first direction X, and a second bridge region 22 is connected between two adjacent island regions 1 in the second direction Y. For example, in the first direction X, first bridge regions 21 each are connected between every two adjacent island regions 1; and in the second direction Y, second bridge regions 22 each are connected between every two adjacent island regions 1.

As shown in FIGS. 2 and 3, the plurality of signal line groups 9 include a plurality of first signal line groups 9A and a plurality of second signal line groups 9B. Each first signal line group 9A extends in the first direction X as a whole, and the first signal line group 9A extends along first bridge regions 21 to island regions 1 that are connected to the first bridge regions 21 and is electrically connected to sub-pixels 8 in the island regions 1.

It will be noted that the description that "each first signal line group 9A extends in the first direction X as a whole" means that each first signal line group 9A has a tendency to extend in the first direction X as the whole. The first signal line group 9A may be in a shape of a straight line, so that all parts of the first signal line group 9A extend in the first direction X. The first signal line group 9A may also be in a shape of a non-straight line, such as a wavy line or a polyline, so that part of the first signal line group 9A may deviate from the first direction X, but the first signal line group 9A has a tendency to extend in the first direction X as a whole.

By arranging in this manner, sub-pixels 8 in each row of island regions 1 in the first direction X are electrically connected to a single first signal line group 9A.

Each second signal line group 9B extends in the second direction Y as a whole, and the second signal line group 9B extends along second bridge regions 22 to island regions 1 that are connected to the second bridge regions 22 and is electrically connected to sub-pixels 8 in the island regions 1.

Same as the description that "each first signal line group 9A extends in the first direction X as s whole", the description that "each second signal line group 9B extends in the second direction Y as a whole" means that each second signal line group 9B has a tendency to extend in the second direction Y as a whole, which will not be repeated herein.

By arranging in this manner, sub-pixels 8 in each column of island regions 1 in to the second direction Y are electrically connected to a single second signal line group 9B.

In the related art, since a signal line itself has impedance, a voltage drop phenomenon (i.e., IR-Drop) will occur during a transmission of a voltage signal on the signal line. Moreover, limited by the precision of a preparation process for signal lines, impedances of different signal lines may be different, resulting in differences in voltage signals received by sub-pixels that are electrically connected to the different signal lines. As a result, it may be possible to cause a difference in light-emitting brightness of the sub-pixels that are electrically connected to the different signal lines, which affects a display effect of a display panel.

To solve the problems, in some embodiments, as shown in FIGS. 2 and 3, the second signal line group 9B includes at least one reference voltage signal line 92, and the first signal line group 9A includes at least one equipotential signal line 93. An equipotential signal line 93 includes a plurality of equipotential wiring segments 94. Every two adjacent equipotential wiring segments 94 are electrically connected to each other. Each equipotential wiring segment 94 extends along a first bridge region 21, and two ends of the equipotential wiring segment 94 are electrically connected to reference voltage signal lines 92 in two island regions 1 that are connected to the first bridge region 21.

In the embodiments of the present disclosure, reference voltage signal lines 92 in every two adjacent island regions 1 are electrically connected through an equipotential wiring segment 94, so that reference voltage signal lines 92 in all island regions 1 are electrically connected, and all the reference voltage signal lines 92 and the equipotential wiring segments 94 form a meshed signal line. The impedance of the meshed signal line is less than that of the reference voltage signal lines 92, which are arranged independently of each other. As a result, it may improve the voltage drop phenomenon that occurs during the transmission of a reference voltage signal on the reference voltage signal line 92.

In addition, the meshed signal line transmits the reference voltage signal, which makes a voltage value of the reference voltage signal transmitted by each reference voltage signal line 92 same or substantially same, and the reference voltage signal received by the sub-pixels 8 that are electrically connected to each reference voltage signal line 92 same or substantially same, thereby reducing the difference in the light-emitting brightness of the sub-pixels 8, which is conducive to improving a display effect of the display panel 100.

In some embodiments, as shown in FIG. 3, the display panel 100 further includes a connection pattern layer 10 disposed in the island region 1. In the island region 1, at least one of the equipotential signal line 93 and the reference voltage signal line 92 is electrically connected to the connection pattern layer 10.

For example, one of two adjacent equipotential wiring segments 94 in an equipotential signal line 93 that extends to a same island region 1 is electrically connected to the connection pattern layer 10.

For example, all reference voltage signal lines 92 in each island region 1 are electrically connected to the connection pattern layer 10, so that all reference voltage signal lines 92 in the island region 1 are electrically connected. All the reference voltage signal lines 92 and the connection pattern layer 10 in each island region 1 form a meshed signal line, so that a voltage value of the reference voltage signal transmitted by each reference voltage signal line 92 is same or substantially same.

For example, in the island region 1, the equipotential signal line 93 and the reference voltage signal lines 92 are all electrically connected to the connection pattern layer 10, and the equipotential signal line 93 and the reference voltage signal lines 92 are electrically connected through the connection pattern layer 10.

In some embodiments, as shown in FIG. 4, the display panel 100 further includes a base 101, and a first gate conductive layer 104, a second gate conductive layer 106, an interlayer dielectric layer 107 and a source-drain conductive layer 108 that are sequentially stacked on the base 101. The plurality of signal line groups 9 are located in the source-drain conductive layer 108, and the connection pattern layer 10 is located in the second gate conductive layer 106.

It will be understood that the plurality of signal line groups 9 and the source-drain conductive layer 108 are made of a same material, and the connection pattern layer 10 and the second gate conductive layer 106 are made of a same material.

Figure 5:
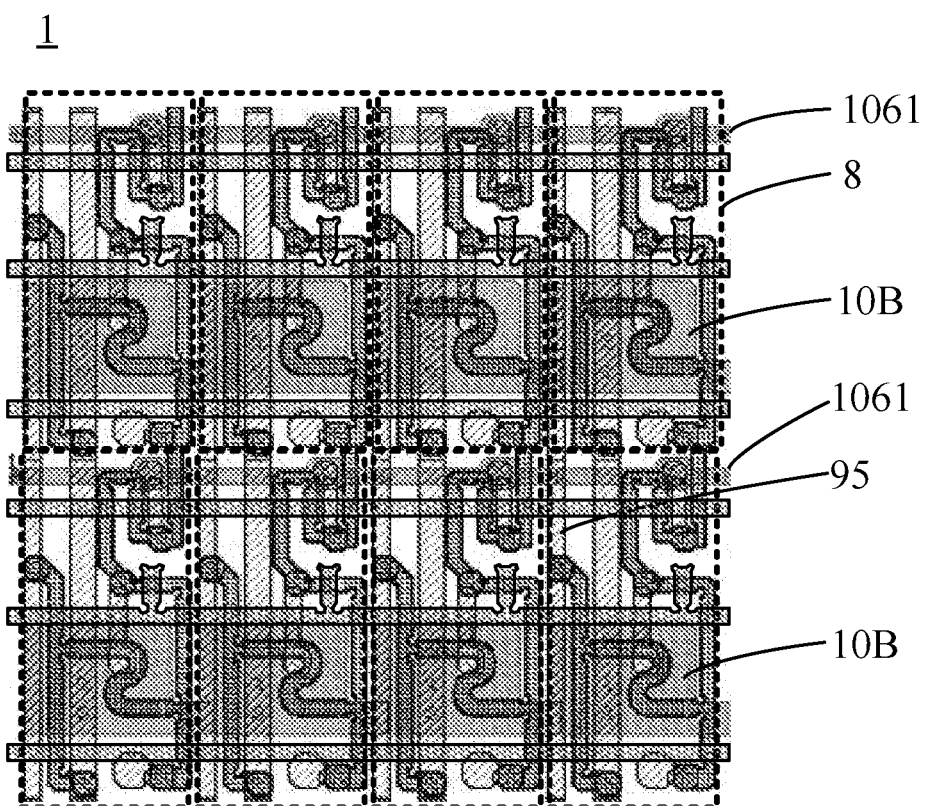
FIG. 5 is a top view of sub-pixels in each island region, in accordance with some embodiments of the present disclosure.

For example, as shown in FIGS. 3 and 5, in a case where the island region 1 are provided with two rows of sub-pixels 8 therein, the connection pattern layer 10 includes two planar connection pattern sub-layers 10B, and a connection pattern sub-layer 10B is electrically connected to a row of sub-pixels 8. In addition, the second gate conductive layer 106 further includes two linear initialization signal line layers 1061, and an initialization signal line layer 1061 is electrically connected to a row of sub-pixels 8.

As shown in FIG. 4, the interlayer dielectric layer 107 is provided with a plurality of via holes H therein. At least one of the equipotential signal line 93 and the reference voltage signal line 92 is electrically connected to the connection pattern layer 10 through at least one via hole H.

For example, the one of the two adjacent equipotential wiring segments 94 in the equipotential signal line 93 that extends to the same island region 1 is electrically connected to the connection pattern layer 10 through at least one via hole H.

For example, all the reference voltage signal lines 92 in the island region 1 are each electrically connected to the connection pattern layer 10 through at least one via hole H, so that all the reference voltage signal lines 92 in the island region 1 are electrically connected.

For example, the equipotential signal line 93 and the reference voltage signal line 92 are each electrically connected to the connection pattern layer 10 through a via hole H, and the equipotential signal line 93 is electrically connected to the reference voltage signal line 92 through the connection pattern layer 10.

For example, the display panel 100 further includes active layers 102 disposed on the base 101. A first gate insulating layer 103 is disposed between the active layers 102 and the first gate conductive layer 104, so as to avoid a short circuit between the active layers 102 and the first gate conductive layer 104.

The display panel 100 further includes a second gate insulating layer 105 disposed between the first gate conductive layer 104 and the second gate conductive layer 106, so as to avoid a short circuit between the first gate conductive layer 104 and the second gate conductive layer 106.

For example, a material of the base 101 includes a flexible material, such as polyimide.

For example, a material of the source-drain conductive layer 108 may be of a laminated structure of titanium, aluminum, and titanium.

In some embodiments, the display panel 100 further includes a plurality of pixel driving circuits disposed on the base 101 and located in the island regions 1. Each pixel driving circuit includes a plurality of thin film transistors. Gates of the thin film transistors are located in the first gate conductive layer 104, and sources and drains of the thin film transistors are located in the source-drain conductive layer 108.

In a wiring design of the signal lines 91, how to achieve the electrically connection between the equipotential signal line 93 and the reference voltage signal line 92 may depend on whether there are other signal lines therebetween in the source-drain conductive layer 108 where they are located.

In some embodiments, as shown in FIGS. 3 and 4, the connection pattern layer 10 includes bridge portions 10A. Two equipotential wiring segments 94 that extend to the same island region 1 and are electrically connected to each other are a first equipotential wiring segment 94A and a second equipotential wiring segment 94B. The first equipotential wiring segment 94A is electrically connected to a reference voltage signal line 92 in the island region 1 through a bridge portion 10A, and the second equipotential wiring segment 94B is directly electrically connected to another reference voltage signal line 92 in the island region 1.

For example, as shown in FIG. 4, the second signal line group 9B further includes a plurality of data signal lines 95. An orthogonal projection of at least one data signal line 95 on the base 101 is spaced between an orthogonal projection of an end portion, electrically connected to the reference voltage signal line 92, of the first equipotential wiring segment 94A on the base 101 and an orthogonal projection of the reference voltage signal line 92, electrically connected to the first equipotential wiring segment 94A, on the base 101. An orthogonal projection of the bridge portion 10A on the base 101 overlaps with the orthogonal projection of the spaced at least one data signal line 95 on the base 101.

It will be understood that, in a case where the at least one data signal line 95 is spaced between the first equipotential wiring segment 94A and the reference voltage signal line 92, the first equipotential wiring segment 94A and the reference voltage signal line 92 are each electrically connected to the bridge portion 10A through a via hole H, and the data signal line 95 is crossed by the bridge portion 10A, thereby achieving an electrical connection between the first equipotential wiring segment 94A and the reference voltage signal line 92.

For example, referring to FIG. 3, an orthogonal projection of an end portion, directly electrically connected to the reference voltage signal line 92, of the second equipotential wiring segment 94B on the base 101 overlaps with an orthogonal projection of the reference voltage signal line 92, electrically connected to the second equipotential wiring segment 94B, on the base 101.

It will be understood that there is no other signal line spaced between the second equipotential wiring segment 94B and the reference voltage signal line 92. In the source-drain conductive layer 108, the second equipotential wiring segment 94B may be directly electrically connected to the reference voltage signal line 92.

In some embodiments, as shown in FIG. 3, the first signal line group 9A further includes a plurality of control signal lines 90, including at least at least one gate scanning signal line 96, at least one initialization signal line 97, at least one light-emitting signal line 98, and at least one reset signal line 99.

The number of the control signal lines 90 included in the first signal line group 9A is less than a sum of the number of the reference voltage signal line(s) 92 and the number of the data signal lines 95 included in the second signal line group 9B. A dimension of the first bridge region 21 in the second direction Y is substantially equal to a dimension of the second bridge region 22 in the first direction X.

It will be noted that the term "substantially" means that the dimension of the first bridge region 21 in the second direction Y and the dimension of the second bridge region 22 in the first direction X are equal, or there is a dimensional difference within an acceptable deviation range therebetween, and the dimensional difference is negligible.

According to the above, the control signal lines 90 included in the first signal line group 9A extend along the first bridge region 21, and the reference voltage signal line(s) 92 and the data signal lines 95 included in the second signal line group 9B extend along the second bridge region 22. In a case where the dimension of the first bridge region 21 in the second direction Y is substantially equal to the dimension of the second bridge region 22 in the first direction X, a vacant region (i.e., a region in which no signal line 91 is provided) in the first bridge region 21 is greater than that in the second bridge region 22. Therefore, the equipotential signal line 93 and the plurality of control signal lines 90 may be provided in the first bridge region 21. In this way, the vacant region of the first bridge region 21 may be used without adding additional wiring regions.

In some embodiments, as shown in FIG. 3, the plurality of control signal lines 90 include two gate scanning signal lines 96, one initialization signal line 97, one light-emitting signal line 98, and one reset signal line 99.

The island region 1 is provided with two rows of sub-pixels 8 therein, and each gate scanning signal line 96 is electrically connected to a row of sub-pixels 8. A gate scanning signal is transmitted to each row of sub-pixels 8 through a gate scanning signal line 96 to control the turn-on and turn-off of the row of sub-pixels. The two rows of sub-pixels 8 are electrically connected to the initialization signal line 97 to simultaneously transmit an initialization signal to the two rows of sub-pixels 8. The two rows of sub-pixels 8 are electrically connected to the light-emitting signal line 98 to simultaneously transmit a light-emitting signal to the two rows of sub-pixels 8. The two rows of sub-pixels 8 are electrically connected to the reset signal line 99 to simultaneously transmit a reset signal to the two rows of sub-pixels 8.

In some embodiments, as shown in FIGS. 2 and 3, in the first signal line group 9A, at least one equipotential signal line 93 is located at a side of two opposite sides of the plurality of control signal lines 90 in the second direction Y, which avoids cross-layer jumpers between the equipotential signal line 93 and the plurality of control signal lines 90, thereby facilitating the electrical connection between the equipotential signal line 93 and the reference voltage signal line 92 in the island region 1.

For example, in two equipotential signal lines 93 in the first signal line group 9A, one equipotential signal line 93 is located at one side of the two opposite sides of the plurality of control signal lines 90 in the second direction Y, and the other equipotential signal line 93 is located at the other side of the two opposite sides of the plurality of control signal lines 90 in the second direction Y.

In some embodiments, as shown in FIGS. 1 and 2, the display panel 100 further has a plurality of opening regions 4. At least a portion of an opening region 4 is located between two adjacent island regions 1 in the first direction X, and at least a portion of another opening region 4 is located between two adjacent island regions 1 in the second direction Y. The display panel 100 will be deformed during a stretching process, and the plurality of opening regions 4 may provide a space for deformation for the stretching of the display panel 100.

A plurality of signal lines 91 of a second signal line group 9B, to which sub-pixels 8 in two adjacent island regions 1 in the first direction X are electrically connected, are arranged substantially symmetrically with a center line F in the second direction Y of an opening region 4 corresponding to two adjacent island regions 1 in the first direction X as an axis of symmetry, which achieves a symmetrical arrangement of the plurality of signal lines 91 of the second signal line group 9B in the first direction X, thereby facilitating the wiring of the plurality of signal lines 91 of the second signal line group 9B. Moreover, it is avoided that there are overlapping portions among the signal lines 91 in the direction E perpendicular to the plane where the display panel 100 is located.

In some embodiments, as shown in FIGS. 1 and 2, a plurality of signal lines 91 of a first signal line group 9A, to which sub-pixels 8 in two adjacent island regions 1 in the second direction Y are electrically connected, are arranged substantially symmetrically with a center line G in the first direction X of an opening region 4 corresponding to two adjacent island regions 1 in the second direction Y as an axis of symmetry, which achieves a symmetrical arrangement of the plurality of signal lines 91 of the first signal line group 9A in the second direction Y, thereby facilitating the wiring of the plurality of signal lines 91 of the first signal line group 9A.

In some other embodiments, as shown in FIGS. 1 and 2, a plurality of signal lines 91 of a second signal line group 9B, to which sub-pixels 8 in two adjacent island regions 1 in the first direction X are electrically connected, are arranged substantially symmetrically with a center line F of an opening region 4 corresponding to the two adjacent island regions 1 in the first direction X as an axis of symmetry. Moreover, a plurality of signal lines 91 of a first signal line group 9A, to which sub-pixels 8 in two adjacent island regions 1 in the second direction Y are electrically connected, are arranged substantially symmetrically with a center line G of an opening region 4 corresponding to the two adjacent island regions 1 in the second direction Y as an axis of symmetry.

By arranging in this manner, it is achieved that the plurality of signal lines 91 of the first signal line group 9A are symmetrically arranged in the second direction Y, and the plurality of signal lines 91 of the second signal line group 9B are symmetrically arranged in the first direction X, thereby facilitating the wiring of the pluralities of signal lines 91 of the first signal line group 9A and the second signal line group 9B.

Moreover, by arranging that the first signal line group 9A is symmetrically arranged and the second signal line group 9B is symmetrically arranged, a relative positional relationship of the signal lines 91 in the same conductive layer remains unchanged, so that a relative positional relationship of portions, electrically connected to the signal lines 91, of the sub-pixels 8 remains unchanged, which facilitates the wiring of the sub-pixels 8 and also reduces the cost.

In some embodiments, as shown in FIG. 1, the opening regions 4 each are in a shape of a capital H, and each include two side holes 5 that are parallel to each other and a middle hole 6 located between the two side holes 5. The middle hole 6 is perpendicular to the two side holes 5, and both ends of the middle hole 6 are communicated with the two side holes 5.

It will be understood that, the side holes 5 of the opening region 4 may provide a space for stretching deformation in an extension direction of a length of the middle hole 6, and the middle hole 6 of the opening region 4 may provide a space for stretching deformation in an extension direction of a length of the side holes 5. Therefore, the opening region 4 formed by the side holes 5 and the middle hole 6 may provide a space for deformation for the display panel 100 in multiple stretching directions.

The plurality of opening regions 4 includes a plurality of first opening regions 41 and a plurality of second opening regions 42. The plurality of first opening regions 41 are arranged into a plurality of rows extending in the first direction X, and middle holes 6 of the first opening regions 41 extend in the first direction X.

The plurality of second opening regions 42 are arranged into a plurality of column extending in the second direction Y, and middle holes 6 of the second opening regions 42 extend in the second direction Y. Two adjacent rows of first opening regions 41 are staggered to each other, and two adjacent columns of second opening regions 42 are staggered to each other.

It will be understood that, as shown in FIG. 1, the two adjacent rows of first opening regions 41 are staggered to each other, which means that among the two adjacent rows of first opening regions 41, a spacing region between two adjacent first opening regions 41 in one row is opposite to a middle hole 6 of a first opening region 41 in the other row; and the two adjacent columns of second opening regions 42 are staggered to each other, which means that among the two adjacent columns of second opening regions 42, a spacing region between two adjacent second opening regions 42 in one column is opposite to a middle hole 6 of a second opening region 42 in the other column. As a result, a region surrounded by the two first opening regions 41 in the two adjacent rows and the two second opening regions 42 in the two adjacent columns forms an island region 1.

In some embodiments, as shown in FIG. 2, a plurality of signal lines 91 of a second signal line group 9B, to which sub-pixels 8 in two adjacent island regions 1 in the first direction X are electrically connected, are arranged substantially symmetrically with a middle hole 6 of a second opening region 42 corresponding to the two adjacent island regions 1 in the first direction X as an axis of symmetry, which achieves a symmetrical arrangement of the plurality of signal lines 91 of the second signal line group 9B in the first direction X, thereby facilitating the wiring of the plurality of signal lines 91 of the second signal line group 9B.

In some other embodiments, as shown in FIG. 2, a plurality of signal lines 91 of a first signal line group 9A, to which sub-pixels 8 in two adjacent island regions 1 in the second direction Y are electrically connected, are arranged substantially symmetrically with a middle hole 6 of a first opening region 41 corresponding to the two adjacent island regions 1 in the second direction Y as an axis of symmetry, which achieves a symmetrical arrangement of the plurality of signal lines 91 of the first signal line group 9A in the second direction Y, thereby facilitating the wiring of the plurality of signal lines 91 of the first signal line group 9A.

In yet some other embodiments, as shown in FIG. 2, a plurality of signal lines 91 of a second signal line group 9B, to which sub-pixels 8 in two adjacent island regions 1 in the first direction X are electrically connected, are arranged substantially symmetrically with a middle hole 6 of a second opening region 42 corresponding to the two adjacent island regions 1 in the first direction X as an axis of symmetry. Moreover, a plurality of signal lines 91 of a first signal line group 9A, to which sub-pixels 8 in two adjacent island regions 1 in the second direction Y are electrically connected, are arranged substantially symmetrically with a middle hole 6 of a first opening region 41 corresponding to the two adjacent island regions 1 in the second direction Y as an axis of symmetry.

By arranging in this manner, it is achieved that the plurality of signal lines 91 of the first signal line group 9A are symmetrically arranged in the second direction Y, and the plurality of signal lines 91 of the second signal line group 9B are symmetrically arranged in the first direction X, thereby facilitating the wiring of the pluralities of signal lines 91 of the first signal line group 9A and the second signal line group 9B.

In some embodiments, as shown in FIG. 2, a bridge region 2 is formed between a side hole 5 of each opening region 4 and a middle hole 6 of another opening region 4 that is closest to the opening region 4. Moreover, bridge regions 2 may be formed at both sides of the middle hole 6, and the two bridge regions 2 at both sides of the middle hole 6 may be symmetrical with respect to the middle hole 6, so that signal lines 91 in the two bridge regions 2 may be symmetrical with respect to the middle hole 6.

Figure 6:
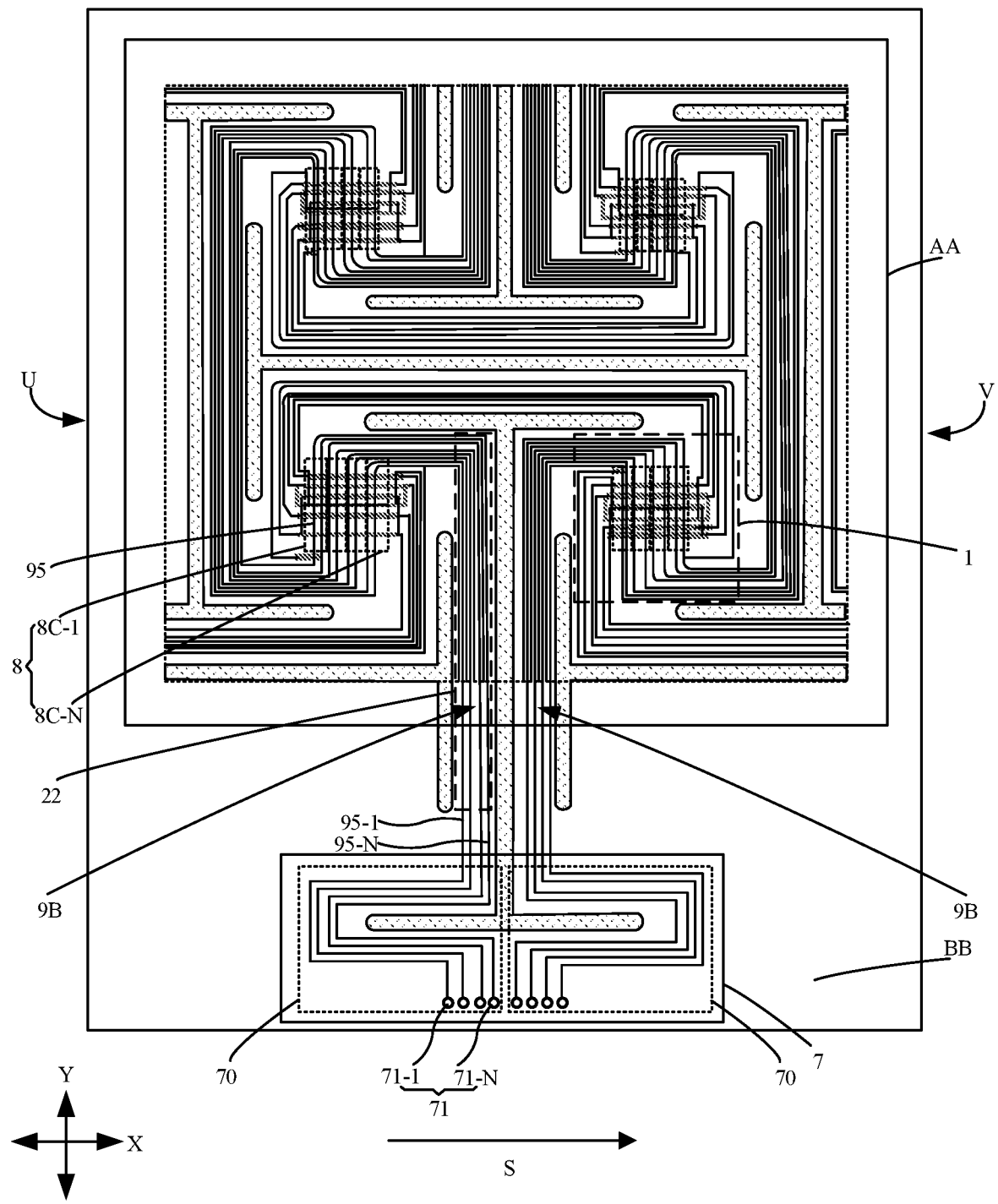
FIG. 6 is a top view of another display panel, in accordance with some embodiments of the present disclosure.

In some embodiments, as shown in FIG. 6, in the first direction X, the display panel 100 has a first end U and a second end V opposite to each other.

The second signal line group 9B includes N data signal lines 95, where N is greater than or equal to 2 (N≥2). In the second bridge region 22, the N data signal lines 95 are arranged in a sequence of a first data signal line 95-1 to an N-th data signal line 95-N in the first direction X and along a direction S from the first end U to the second end V of the display panel 100.

The island region 1 is provided with N columns of sub-pixels 8, and the N columns of sub-pixels 8 are arranged in a sequence of a first column of sub-pixels 8C-1 to an N-th column of sub-pixels 8C-N in the first direction X and along the direction S from the first end U to the second end V of the display panel 100.

For example, as shown in FIG. 5, each island region 1 is provided with 4 multiply by 2 (4×2) sub-pixels 8. That is, the second signal line group 9B includes four data signal lines 95, the island region 1 is provided with four columns of sub-pixels 8, and each data signal line 95 is electrically connected to 1 multiply by 2 (1×2) sub-pixels 8.

Each column of sub-pixels 8 is electrically connected to a data signal line 95, and a sum of a serial number of the column where each pair of sub-pixels 8 that are electrically connected is located and a serial number of the data signal line 95 is equal to (N+1). That is, an i-th column of sub-pixels 8 is electrically connected to an (N+1−i)-th data signal line 95, where i takes a value from 1 to N (i=1 to N).

For example, as shown in FIG. 6, in a case where the second signal line group 9B includes four data signal lines 95, and the island region 1 is provided with four columns of sub-pixels 8, N is equal to 4 (N=4). That is, the sum of the serial number of the column where each pair of sub-pixels 8 that are electrically connected is located and the serial number of the data signal line 95 is equal to 5 (i.e., N+1=5).

The first column of sub-pixels are electrically connected to a fourth data signal line, and a sum of a serial number of the column of sub-pixels 8 and a serial number of the data signal line 95 is equal to 5 (i.e., 1+4=5).

A second column of sub-pixels are electrically connected to a third data signal line, and a sum of a serial number of the column of sub-pixels 8 and a serial number of the data signal line 95 is equal to 5 (i.e., 2+3=5).

A third column of sub-pixels are electrically connected to a second data signal line, and a sum of a serial number of the column of sub-pixels 8 and a serial number of the data signal line 95 is equal to 5 (i.e., 3+2=5).

A fourth column of sub-pixels are electrically connected to a first data signal line, and a sum of a serial number of the column of sub-pixels 8 and a serial number of the data signal line 95 is equal to 5 (i.e., 4+1=5).

It will be understood that, as for each column of sub-pixels 8 located in the island region 1 and the data signal lines 95 located in the second bridge region 22, a distance between the fourth column of sub-pixels and the first data signal line 95, a distance between the third column of sub-pixels and the second data signal line 95, a distance between the second column of sub-pixels and the third data signal line 95, and a distance between the first column of sub-pixels and the fourth data signal line 95 increase sequentially. Through the electrical connection between the data signal lines 95 and the columns of sub-pixels 8, the data signal lines 95 are arranged in parallel and at intervals, thereby avoiding the cross-layer jumpers between the data signal lines 95.

In some embodiments, as shown in FIG. 6, the display panel 100 further includes a plurality of pin groups 70. Each pin group 70 corresponds to a second signal line group 9B. The pin group 70 includes N pins 71, and the N pins 71 are arranged in a sequence of a first pin 71-1 to an N-th pin 71-N in the first direction X and along the direction S from the first end U to the second end V of the display panel 100. The N pins 71 are electrically connected to N data signal lines 95 of the corresponding second signal line group 9B.

In the pin group 70, an i-th pin is configured to be electrically connected to a source driver and receive data signals of an (N+1−i)-th column of sub-pixels 8 from the source driver, where i takes a value from 1 to N (i=1 to N).

It will be noted that a region where the plurality of island regions 1 of the display panel 100 are located is a display area AA, and a peripheral area BB is further provided at least one side of the display area. The plurality of pin groups 70 are disposed in the peripheral area BB. The plurality of pins 71 included in each pin group 70 are arranged in parallel in the first direction X and along the direction S. That is, the plurality of pins 71 are arranged in parallel in a side of the display area AA proximate to the peripheral area BB. The plurality of pin groups 70 are used for bonding a flexible circuit board, so that the plurality of pin groups 70 are electrically connected to the source driver through the flexible circuit board.

For example, as shown in FIG. 6, the second signal line group 9B includes the four data signal lines 95, and each pin group 70 includes four pins 71. In the first direction X and along the direction S from the first end U to the second end V of the display panel 100, the first data signal line is electrically connected to the first pin. The first pin is configured to receive data signals of the fourth column of sub-pixels 8 from the source driver.

The second data signal line is electrically connected to a second pin, and the second pin is configured to receive data signals of the third column of sub-pixels 8 from the source driver.

The third data signal line is electrically connected to a third pin, and the third pin is configured to receive data signals of the second column of sub-pixels 8 from the source driver.

The fourth data signal line is electrically connected to a fourth pin, and the fourth pin is configured to receive data signals of the first column of sub-pixels 8 from the source driver.

In some embodiments, as shown in FIG. 6, the display panel 100 further has a plurality of pin regions 7. Two pin groups 70 corresponding to two second signal line groups 9B that are arranged substantially symmetrically are provided in a same pin region 7.

For example, two pin groups 70 in the same pin region 7 are electrically connected to a same source driver. That is, every two adjacent columns of sub-pixels 8 receive data signals output from the same source driver.

It will be understood that the plurality of pin regions 7 are disposed in the peripheral area BB, and are arranged in parallel in the first direction X and along the direction S. That is, the plurality of pin regions 7 are arranged in parallel in the side of the display area AA proximate to the peripheral area BB.

In some embodiments, as shown in FIG. 6, each signal line 91 of the second signal line group 9B is electrically connected to sub-pixels 8 in an island region 1 after being bent twice.

For example, the signal lines 91 of the second signal line group 9B are bent twice by 90 degrees in a clockwise direction, or bent twice by 90 degrees in a counterclockwise direction, and extend into the island region 1 in a way of routing around the sub-pixels 8, so that the plurality of signal lines 91 of the second signal line group 9B are arranged in parallel and at intervals in the same conductive layer.

In some other embodiments, as shown in FIG. 6, each signal line 91 of the first signal line group 9A is electrically connected to sub-pixels 8 in an island region 1 after being bent twice.

For example, the signal lines 91 of the first signal line group 9A are bent twice by 90 degrees in a same direction, and extend into the island region 1 in the way of routing around the sub-pixels 8, so that the plurality of signal lines 91 of the first signal line group 9A are arranged in parallel and at intervals in the same conductive layer.

In yet some other embodiments, as shown in FIG. 6, each signal line 91 of the second signal line group 9B is electrically connected to sub-pixels 8 in an island region 1 after being bent twice, and each signal line 91 of the first signal line group 9A is electrically connected to sub-pixels 8 in another island region 1 after being bent twice.

For example, signal lines 91 of both the first signal line group 9A and the second signal line group 9B are bent twice by 90 degrees in a same direction, and extend into the island region 1 in the way of routing around the sub-pixels 8, so that the plurality of signal lines 91 of both the first signal line group 9A and the second signal line group 9B are arranged in parallel and at intervals in the same conductive layer.

Figure 7:
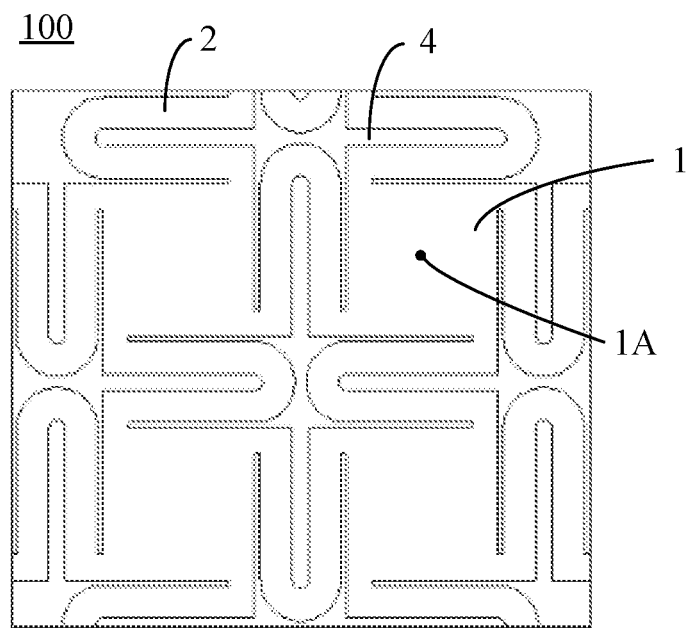
FIG. 7 is a top view of yet another display panel, in accordance with some embodiments of the present disclosure.
Figure 8:
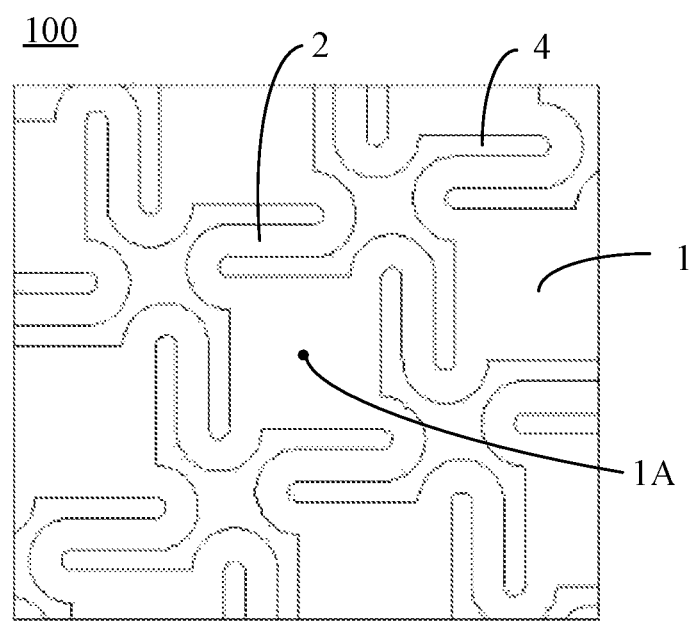
FIG. 8 is a top view of yet another display panel, in accordance with some embodiments of the present disclosure.

In some embodiments, as shown in FIGS. 1, 7 and 8, the bridge region 2 may be in a shape of a rectangle, a capital U, or a capital S. By designing bridge regions 2 in different shapes, it may be possible to improve tensile properties of the bridge regions 2 of the display panel 100.

Each island region 1 is connected to four bridge regions 2, and the four bridge regions 2 surround the island region 1. A center 1A of the island region 1 serves as a center of symmetry, and a plurality of signal lines in a plurality of bridge regions 2 connected to each island region 1 are arranged symmetrically with respect to the center, so that the signal lines 91 may be reasonably arranged in the bridge regions 2 of different shapes, thus facilitating that the signal lines are arranged in parallel and at intervals in the same conductive layer.

Figure 9:
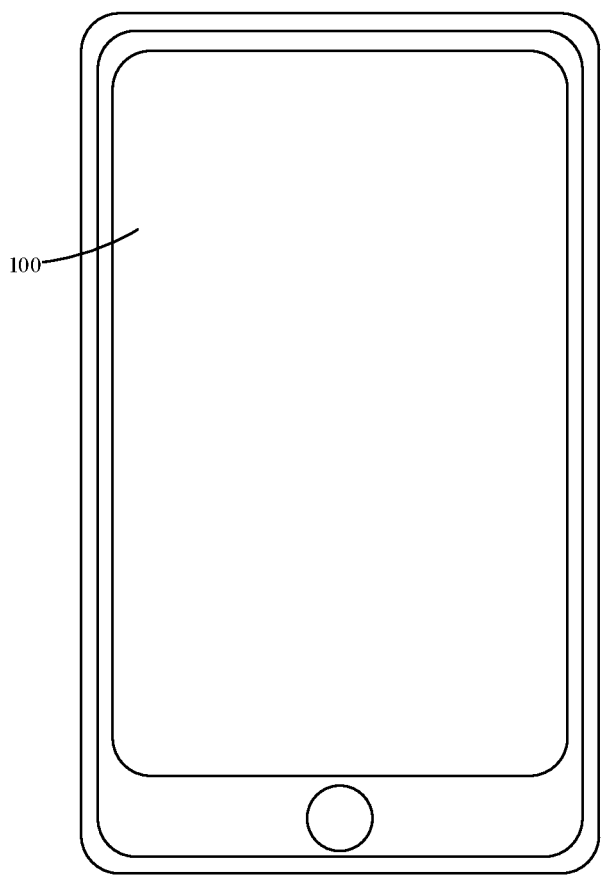
FIG. 9 is a top view of a display device, in accordance with some embodiments of the present disclosure.

Some embodiments of the present disclosure provide a display device 200, as shown in FIG. 9, including the display panel 100 in any one of the above embodiments. The display device 200 may be an organic light-emitting diode (OLED) display device, such as an active matrix organic light-emitting diode (AMOLED) display device.

The display device 200 may be any device that displays images whether in motion (e.g., a video) or stationary (e.g., a static image), and whether literal or graphical. More specifically, it is anticipated that the described embodiments may be implemented in or associated with a variety of electronic devices. The variety of electronic devices may be, for example (but not limited to), mobile phones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, television monitors, flat-panel displays, computer monitors, automobile displays (e.g., odometer displays), navigators, cockpit controllers and/or displays, camera view displays (e.g., rear view camera displays in vehicles), electronic photos, electronic billboards or signs, projectors, building structures, and packaging and aesthetic structures (e.g., a display for an image of a piece of jewelry).

The foregoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A stretchable display panel having a plurality of island regions and a plurality of bridge regions, the plurality of island regions being arranged in an array, and every two adjacent island regions being connected with a bridge region in the plurality of bridge regions therebetween; wherein the plurality of bridge regions include a plurality of first bridge regions and a plurality of second bridge regions, a first bridge region in the plurality of first bridge regions is connected between two adjacent island regions in a first direction, and a second bridge region in the plurality of second bridge regions is connected between two adjacent island regions in a second direction, the first direction is a row direction in which the plurality of island regions are arranged in the array, and the second direction is a column direction in which the plurality of island regions are arranged in the array;

the display panel comprising:
a plurality of sub-pixels, at least one sub-pixel being provided in each island region; and
a plurality of signal line groups located in a same conductive layer; each signal line group extending along bridge regions to island regions that are connected to the bridge regions, the signal line group including a plurality of signal lines arranged in parallel and at intervals, each signal line being electrically connected to sub-pixels in the island regions;

wherein the plurality of signal line groups include:
a plurality of first signal line groups; each first signal line group extending in the first direction as a whole, and the first signal line group extending along the first bridge regions to island regions that are connected to the first bridge regions and being electrically connected to sub-pixels in the island regions; and
a plurality of second signal line groups; each second signal line group extending in the second direction as a whole, and the second signal line group extending along the second bridge regions to island regions that are connected to the second bridge regions and being electrically connected to sub-pixels in the island regions;

wherein the second signal line group includes at least one reference voltage signal line; and the first signal line group includes at least one equipotential signal line, in the at least one equipotential signal line, an equipotential signal line includes a plurality of equipotential wiring segments, every two adjacent equipotential wiring segments are electrically connected to each other; each equipotential wiring segment extends along a first bridge region in the plurality of first bridge regions, and two ends of the equipotential wiring segment are electrically connected to reference voltage signal lines in two island regions that are connected to the first bridge region;

wherein the first signal line group further includes a plurality of control signal lines including at least a gate scanning signal line, an initialization signal line, a light-emitting signal line, and a reset signal line; and the second signal line group further includes a plurality of data signal lines;

wherein a number of the control signal lines included in the first signal line group is less than a sum of a number of the reference voltage signal line and a number of the data signal lines included in the second signal line group; and a dimension of the first bridge region in the second direction is substantially equal to a dimension of the second bridge region in the first direction.

2. The display panel according to claim 1, further comprising:
a plurality of connection pattern layers, and each island region being provided with a connection pattern layer therein; in the island region, at least one of the equipotential signal line and the reference voltage signal line being electrically connected to the connection pattern layer.

3. The display panel according to claim 2, further comprising: a base, and a first gate conductive layer, a second gate conductive layer, an interlayer dielectric layer and a source-drain conductive layer that are sequentially stacked on the base; wherein
the plurality of signal line groups are located in the source-drain conductive layer, and the plurality of connection pattern layers are located in the second gate conductive layer; and
the interlayer dielectric layer is provided with a plurality of via holes therein, and the at least one of the equipotential signal line and the reference voltage signal line is electrically connected to the connection pattern layer through at least one via hole.

4. The display panel according to claim 3, wherein the at least one reference voltage signal line includes at least two reference voltage signal lines;
each connection pattern layer includes a plurality of bridge portions; and
two equipotential wiring segments that extend to a same island region and are electrically connected to each other are a first equipotential wiring segment and a second equipotential wiring segment; the first equipotential wiring segment is electrically connected to a reference voltage signal line in the same island region through a bridge portion in a plurality of bridge portions of a connection pattern layer in the same island region, and the second equipotential wiring segment is directly electrically connected to another reference voltage signal line in the same island region.

5. The display panel according to claim 4, wherein
an orthogonal projection of at least one data signal line on the base is spaced between an orthogonal projection of an end portion, electrically connected to the reference voltage signal line, of the first equipotential wiring segment on the base and an orthogonal projection of the reference voltage signal line, electrically connected to the first equipotential wiring segment, on the base; and an orthogonal projection of the bridge portion on the base overlaps with the orthogonal projection of the at least one data signal line on the base; and
an orthogonal projection of an end portion, electrically connected to the another reference voltage signal line, of the second equipotential wiring segment on the base overlaps with an orthogonal projection of the another reference voltage signal line, electrically connected to the second equipotential wiring segment, on the base.

6. The display panel according to claim 1, wherein in the first signal line group, the equipotential signal line is located at a side of two opposite sides of the plurality of control signal lines in the second direction.

7. The display panel according to claim 1, wherein the display panel further has a plurality of opening regions;
wherein at least a portion of an opening region in the plurality of opening regions is disposed between two adjacent island regions in the first direction, and a plurality of signal lines of the second signal line group in the plurality of second signal line groups, to which sub-pixels in the two adjacent island regions are electrically connected, are arranged substantially symmetrically with a center line in the second direction of the opening region corresponding to the two adjacent island regions as an axis of symmetry; and/or
at least a portion of another opening region in the plurality of opening regions is disposed between two adjacent island regions in the second direction, and a plurality of signal lines of the first signal line group in the plurality of first signal line groups, to which sub-pixels in the two adjacent island regions are electrically connected, are arranged substantially symmetrically with a center line in the first direction of the opening region corresponding to the two adjacent island regions as an axis of symmetry.

8. The display panel according to claim 7, wherein the opening regions each are in a shape of a capital H, and each include two side holes that are parallel to each other and a middle hole located between the two side holes; the middle hole is perpendicular to the two side holes, and both ends of the middle hole are communicated with the two side holes;
the plurality of opening regions includes a plurality of first opening regions and a plurality of second opening regions; the plurality of first opening regions are arranged into a plurality of rows extending in the first direction, and middle holes of the first opening regions extend in the first direction; the plurality of second opening regions are arranged into a plurality of columns extending in the second direction, and middle holes of the second opening regions extend in the second direction; and two adjacent rows of first opening regions are staggered to each other, and two adjacent columns of second opening regions are staggered to each other; and
the plurality of signal lines of the second signal line group, to which the sub-pixels in the two adjacent island regions in the first direction are electrically connected, are arranged substantially symmetrically with a middle hole of a second opening region corresponding to the two adjacent island regions as an axis of symmetry.

9. The display panel according to claim 7, wherein in the first direction, the display panel has a first end and a second end opposite to each other;
the second signal line group includes N data signal lines, and N is greater than or equal to 2; and in the second bridge region, the N data signal lines are arranged in a sequence of a first data signal line to an N-th data signal line in the first direction and along a direction from the first end to the second end of the display panel;
an island region connected with the second bridge region is provided with N columns of sub-pixels, and the N columns of sub-pixels are arranged in a sequence of a first column of sub-pixels to an N-th column of sub-pixels in the first direction and along the direction from the first end to the second end of the display panel; and
each column of sub-pixels is electrically connected to a data signal line, and a sum of a serial number of the column of sub-pixels and a serial number of the data signal line is equal to (N+1).

10. The display panel according to claim 9, further comprising:
a plurality of pin groups, each pin group corresponding to a second signal line group in the plurality of second signal line groups; the pin group including N pins, the N pins being arranged in a sequence of a first pin to an N-th pin in the first direction and along the direction from the first end to the second end of the display panel, and the N pins being electrically connected to N data signal lines of the corresponding second signal line group; wherein
in the pin group, an i-th pin being configured to be electrically connected to a source driver to receive data signals of an (N+1−i)-th column of sub-pixels from the source driver, wherein i takes a value from 1 to N.

11. The display panel according to claim 10, wherein the display panel further has a plurality of pin regions; and
two pin groups corresponding to two second signal line groups that are arranged substantially symmetrically are provided in a same pin region.

12. The display panel according to claim 7, wherein each signal line in the second signal line group is electrically connected to sub-pixels in each of the island regions after being bent twice.

13. The display panel according to claim 7, wherein the opening regions each are in a shape of a capital H, and each include two side holes that are parallel to each other and a middle hole located between the two side holes; the middle hole is perpendicular to the two side holes, and both ends of the middle hole are communicated with the two side holes;
the plurality of opening regions includes a plurality of first opening regions and a plurality of second opening regions; the plurality of first opening regions are arranged into a plurality of rows extending in the first direction, and middle holes of the first opening regions extend in the first direction; the plurality of second opening regions are arranged into a plurality of columns extending in the second direction, and middle holes of the second opening regions extend in the second direction; and two adjacent rows of first opening regions are staggered to each other, and two adjacent columns of second opening regions are staggered to each other; and
the plurality of signal lines of the first signal line group, to which the sub-pixels in the two adjacent island regions in the second direction are electrically connected, are arranged substantially symmetrically with a middle hole of a first opening region corresponding to the two adjacent island regions as an axis of symmetry.

14. The display panel according to claim 7, wherein each signal line in the first signal line group is electrically connected to sub-pixels in each of the island regions after being bent twice.

15. The display panel according to claim 1, wherein the bridge regions each are in a shape of a rectangle, a capital U, or a capital S; and
each island region is connected to four bridge regions, the four bridge regions surround the island region, and a plurality of signal lines in the four bridge regions are arranged symmetrically with respect to a center of the island region.

16. A display device, comprising the display panel according to claim 1.

* * * * *